(12) United States Patent
Wakizako et al.

(10) Patent No.: US 7,008,884 B2
(45) Date of Patent: Mar. 7, 2006

(54) TRANSFER ROBOT AND INSPECTION METHOD FOR THIN SUBSTRATE

(75) Inventors: Hitoshi Wakizako, Fukuoka (JP); Kazunari Shiraishi, Fukuoka (JP); Yukito Sagasaki, Fukuoka (JP); Ken-ichi Motonaga, Fukuoka (JP); Kazunori Hino, Fukuoka (JP); Hiroki Sanemasa, Fukuoka (JP)

(73) Assignee: Kabushiki Kaisha Yaskawa Denki, Fukuoka (JP)

( * ) Notice: Subject to any disclaimer, the term of this patent is extended or adjusted under 35 U.S.C. 154(b) by 0 days.

(21) Appl. No.: 10/433,333

(22) PCT Filed: Nov. 26, 2001

(86) PCT No.: PCT/JP01/10293

§ 371 (c)(1),
(2), (4) Date: Jun. 2, 2003

(87) PCT Pub. No.: WO02/45154

PCT Pub. Date: Jun. 6, 2002

(65) Prior Publication Data
US 2004/0034976 A1    Feb. 26, 2004

(30) Foreign Application Priority Data
Dec. 1, 2000 (JP) ............................. 2000-367616
May 18, 2001 (JP) ............................. 2001-148970

(51) Int. Cl.
*H01L 31/0232* (2006.01)

(52) U.S. Cl. ..................... 438/782; 438/7; 438/16; 438/716; 414/935; 414/936; 414/937; 414/938; 414/940; 29/25.01

(58) Field of Classification Search ................ 438/716, 438/782, 7, 16; 414/935, 936, 937, 938, 414/940; 29/25.01
See application file for complete search history.

(56) References Cited

U.S. PATENT DOCUMENTS

| | | | |
|---|---|---|---|
| 4,687,326 A | * | 8/1987 | Corby, Jr. .................. 356/5.01 |
| 5,515,599 A | * | 5/1996 | Best ............................ 29/705 |
| 5,645,391 A | | 7/1997 | Ohsawa et al. |
| 5,743,005 A | * | 4/1998 | Nakao et al. ................. 29/833 |
| 5,768,768 A | * | 6/1998 | Best ............................ 29/792 |
| 5,813,819 A | | 9/1998 | Ohsawa et al. |

FOREIGN PATENT DOCUMENTS

| JP | 60-39087 A | 2/1985 |
|---|---|---|
| JP | 5-343495 A | 12/1993 |
| WO | WO 00/02239 A1 | 1/2000 |

* cited by examiner

*Primary Examiner*—George Fourson
*Assistant Examiner*—Joannie Adelle Garcia
(74) *Attorney, Agent, or Firm*—Sughrue Mion, PLLC

(57) ABSTRACT

A transfer robot (5) for thin substrate capable of efficiently detecting the stored state of thin substrates and an inspection method for thin substrate capable of accurately detecting the stored state of thin substrates; the robot (5), comprising an inspection camera (1) for detecting the stored state of the thin substrates (3) in a storage cassette (2), wherein the plurality of thin substrates (3) stored in the storage cassette (2) are carried out from the storage cassette (2) by the robot.

4 Claims, 5 Drawing Sheets

TRANSFER ROBOT AND INSPECTION METHOD FOR THIN SUBSTRATE

TECHNICAL FIELD

The present invention relates to an apparatus for manufacturing liquid crystal substrates or semiconductors, and, particularly, to a thin-substrate transfer robot that carries out thin substrates, such as liquid crystal substrates or wafers, from a storage cassette, such as a wafer cassette, and to a method for detecting the state of thin substrates in the storage cassette.

BACKGROUND ART

In the process of manufacturing semiconductors or liquid crystals, thin substrates, which are substances to be processed like liquid crystal substrates or wafers, are stored in a storage cassette, and they are transferred between processing devices in the respective steps. The storage cassette is a box-like container that stores a plurality of thin substrates stacked, whose inner wall is cut to have a plurality of shelf-like grooves, and in which the thin substrates are inserted into the grooves, respectively, so as not to bring the stacked substrates into contact with each other.

When the storage cassette arrives at each step, a thin-substrate transfer robot carries out the thin substrates from the storage cassette and carries them into the processing device, and, when the processing is completed, the thin-substrate transfer robot stores the thin substrates in the storage cassette again. Generally, before extracting the thin substrates from the storage cassette, an inspection is made as to whether the thin substrates are stored in the cassette at a correct posture or not. The reason is that, if the thin substrates are stored at an abnormal posture like two-substrate insertion or oblique insertion, the thin-substrate transfer robot cannot extract the substrates from the storage cassette, and, if the substrates assuming such an abnormal posture are forcibly extracted therefrom, the storage cassette or the substrates will be damaged.

For this inspection, a method has been performed such that a transmission type or reflection type optical sensor using a laser beam or an LED beam is disposed in the vicinity of the storage cassette, and the state of the thin substrates in the storage cassette is detected.

However, a long-unsolved problem resides in that these optical sensors have difficulty in detecting a state (two-substrate insertion state) where two substrates are inserted in the same groove in two-ply form although the sensors can detect the presence or absence of the thin substrates. Another unsolved problem resides in that, since the detecting distance is short, the sensors must be moved in the vicinity of the thin substrates, and particles arise and contaminate the substrates. In recent years, an inspection method through image processing by use of a camera has been proposed in order to solve these problems.

FIG. 6 is a perspective view showing the structure of a thin-substrate inspecting apparatus that uses a camera.

In the figure, 1 denotes an inspection camera that is connected to an image processing apparatus not shown. 2 denotes a storage cassette in the interior of which a plurality of thin substrates 3 are stacked and stored.

The inspection camera 1 picks up an image of the thin substrates 3 stored in the storage cassette 2, and detects the state of the wafers 3 by processing this image. Since the inspection camera 1 performs photography while enlarging the limited field of view 4 so that the two-ply state of the thin substrates can be detected, the entire storage cassette 2 cannot be photographed at a time. Therefore, the camera 1 is moved in the upward/downward direction along an arrow 100 in order to detect the state of all thin substrates 3.

However, the following problems have arisen in using the camera.

(1) Since the field of view of the camera is limited, a driving device for moving the position and direction of the camera is required in order to see all wafers in the storage cassette. The camera having such a driving device interferes with a thin-substrate transfer robot because the camera requires large dimensions.

(2) If the camera and the driving device are disposed to avoid interference, the camera cannot be disposed at the most suitable position for inspection, and therefore inspection accuracy will deteriorate.

(3) Since much time is consumed to move the camera, inspection time becomes long.

DISCLOSURE OF INVENTION

It is therefore an object of the present invention to provide a thin-substrate transfer robot that efficiently detects the stored state of thin substrates. It is another object of the present invention to provide a thin-substrate inspection method for detecting the stored state of thin substrates with high accuracy In order to achieve the objects, the invention as set forth in Claim 1, wherein a thin-substrate transfer robot carries out a plurality of thin substrates stored in a storage cassette from the storage cassette, a camera for detecting the stored state of the thin substrates in the storage cassette is attached to the thin-substrate transfer robot.

The invention as set forth in Claim 2, wherein the camera is attached to an arm of the thin-substrate transfer robot.

The invention as set forth in Claim 3, wherein the camera is attached to a body of the thin-substrate transfer robot.

The invention as set forth in Claim 4, wherein the camera is attached so that an optical axis of the camera is directed toward the center of the thin substrates when the thin-substrate transfer robot assumes a posture in which the thin substrates are extracted from the storage cassette.

The invention as set forth in Claim 5, wherein the camera is attached to the thin-substrate transfer robot through a pedestal that can freely adjust and fix a direction of the optical axis of the camera.

The thin-substrate transfer robot as set forth in Claim 6 is a horizontal articulated robot comprising; a first arm that is attached to the body and freely turns in a horizontal plane, a second arm that is attached to a tip of the first arm and freely turns in a horizontal plane, and a fork that is attached to a tip of the second arm and freely turns in a horizontal plane, wherein the camera is contained in the vicinity of a pivot of the first arm.

The invention as set forth in Claim 7, wherein a thin-substrate inspection method for detecting a stored state of a plurality of thin substrates stored in a storage cassette by use of a camera, the camera is disposed on a thin-substrate transfer robot that transfers the thin substrates, and an image of all of the thin substrates in the storage cassette is picked up by the camera by moving the thin-substrate transfer robot in a vertical direction, thereby inspecting the state of the thin substrates.

The invention as set forth in Claim 8, wherein a thin-substrate inspection method for detecting a stored state of a plurality of thin substrates stored in a storage cassette having a door by use of a camera, the camera is disposed on a thin-substrate transfer robot that transfers the thin substrates, and an image of all of the thin substrates in the storage cassette is picked up by the camera while moving the thin-substrate transfer robot in a vertical direction synchronously with a driving device for opening the door of the storage cassette, thereby detecting the state of the thin substrates.

BEST MODE FOR CARRYING OUT THE INVENTION

Embodiments of the present invention will hereinafter be described with reference to the drawings.

Figure 1:
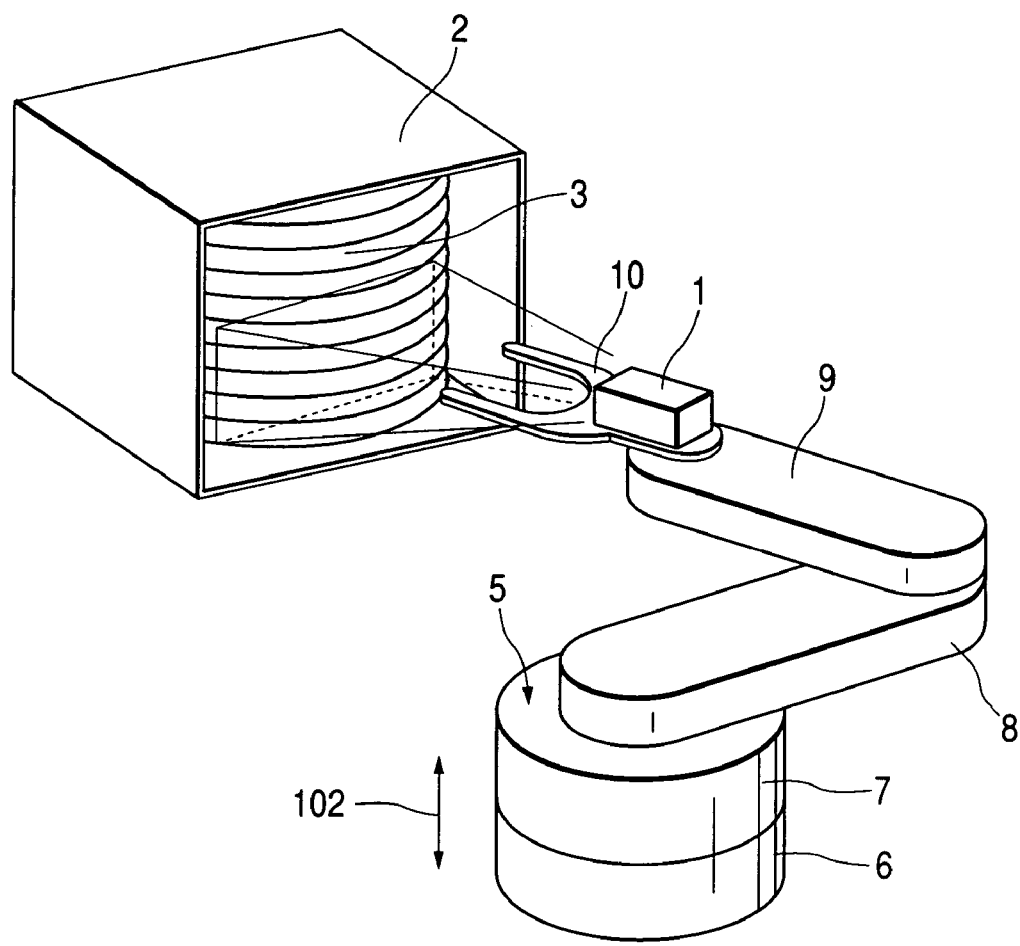
FIG. 1 is a perspective view showing a first embodiment of the present invention.

FIG. 1 is a perspective view of a thin-substrate transfer robot showing the first embodiment of the present invention.

In the figure, 5 denotes the thin-substrate transfer robot. The thin-substrate transfer robot 5 has a base 6 fixed to an installation location, a body 7 that is attached to the base 6 and turns within a horizontal plane and goes up and down in the upward/downward direction, a first arm 8 that is attached to the body 7 and turns within a horizontal plane, a second arm 9 that is attached to the first arm 8 and turns within a horizontal plane, and a fork 10 that is attached to the second arm 9 and turns within a horizontal plane. The fork 10 is a kind of mechanical hand on which thin substrates are placed.

An inspection camera 1 is fixed to the upper surface of the fork 10. Therefore, the inspection camera 1 can pick up an image of all thin substrates 3 in a storage cassette 2 while going up and down and turning synchronously with the fork 10, and can inspect the state thereof.

Figure 2:
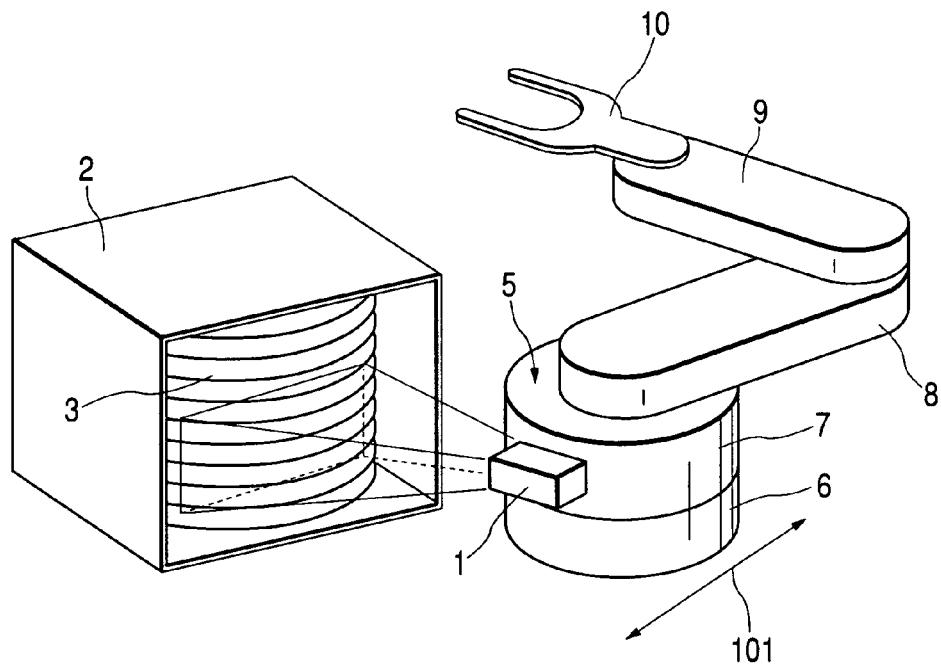
FIG. 2 is a perspective view showing a second embodiment of the present invention.

FIG. 2 is a perspective view of the thin-substrate transfer robot showing the second embodiment of the present invention.

In this embodiment, the inspection camera 1 is fixed to the side face of the body 7 of the thin-substrate transfer robot 5. The thin-substrate transfer robot 5 further has a traverse mechanism not shown, by which the whole of the thin-substrate transfer robot 5 traverses in the direction of an arrow 101.

When the thin substrates 3 in the interior of the storage cassette 2 are detected, the traverse mechanism allows the thin-substrate transfer robot 5 to traverse so that the optical axis of the inspection camera 1 faces the thin substrates 3, and, after the detection is completed, it again allows the thin-substrate transfer robot 5 to traverse so that the fork 10 faces the thin substrates 3.

Figure 3:
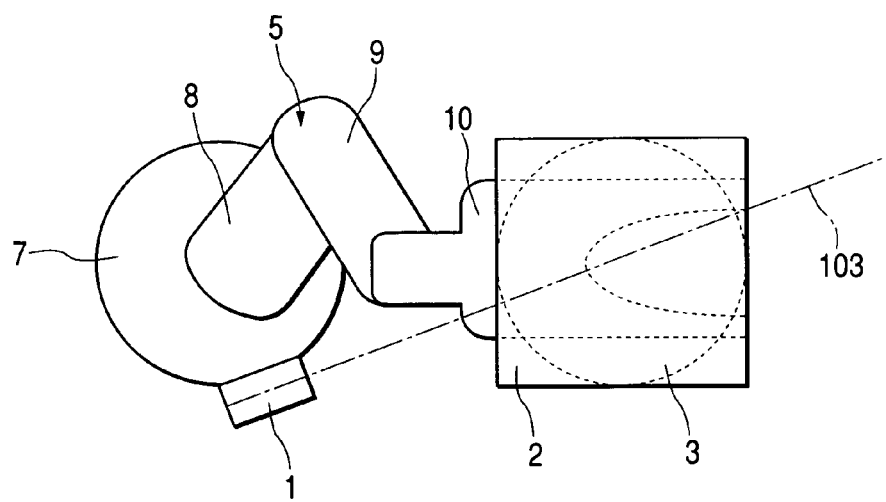
FIG. 3 is a plan view showing a third embodiment of the present invention.

FIG. 3 is a plan view of the thin-substrate transfer robot showing the third embodiment of the present invention.

In the figure, the inspection camera 1 is attached to the side face of the body 7 by selecting a setting position and a setting angle by which the optical axis 103 of the inspection camera 1 passes through the center of the thin substrates 3 when the body 7 is turned so that the fork 10 faces the storage cassette 2.

Since the camera 1 is attached in this way, the optical axis 103 of the inspection camera 1 is directed toward the center of the thin substrates 3 when the thin-substrate transfer robot 5 assumes a posture in which the thin substrates 3 are extracted from the storage cassette 2, and, unlike the second embodiment, there is no need to allow the thin-substrate transfer robot 5 to traverse whenever detected and be carried out, and detection time can be shortened proportionately therewith.

It is to be noted that the optical axis 103 of the inspection camera 1 is not necessarily required to completely coincide with the center of the thin substrates 3, and the optical axis 103 should fall within a range capable of performing the detection processing of the thin substrates 3.

Additionally, if the inspection camera 1 is attached through a pedestal by which the camera 1 can be fixed at a desired position by freely adjusting the direction of the optical axis of the camera 1 without fixing the camera 1 directly to the body 7, it is convenient for adjustment of the optical axis.

Figure 4:
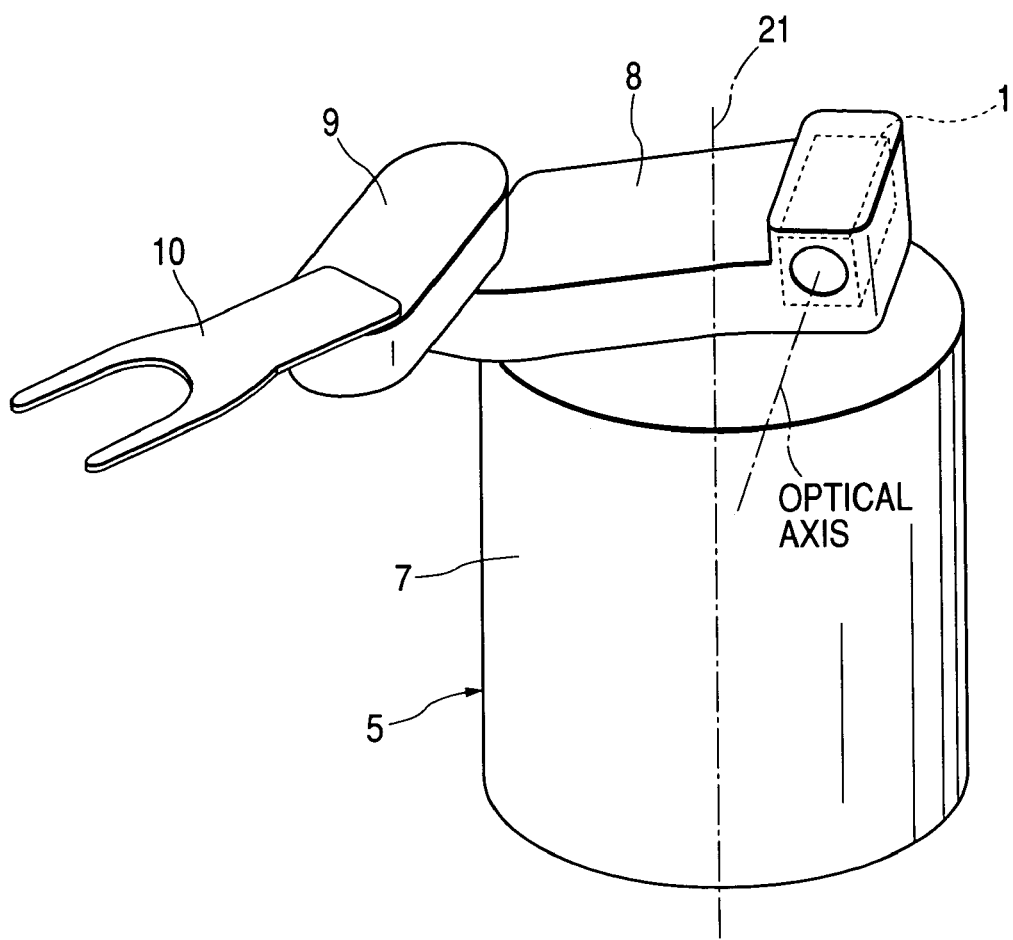
FIG. 4 is a perspective view showing a fourth embodiment of the present invention.

FIG. 4 is a perspective view of the thin-substrate transfer robot showing the fourth embodiment of the present invention.

The thin-substrate transfer robot 5 in this embodiment is a horizontal articulated robot identical to that in the aforementioned first to third embodiments, in which the first arm 8 is attached to the body 7 and freely turns in a horizontal plane, the second arm 9 is attached to the tip of the first arm 8 and freely turns in a horizontal plane, and the fork 10 is attached to the tip of the second arm 9 and freely turns in a horizontal plane.

The inspection camera 1 is contained in the vicinity of a pivot 21 of the first arm 8, and is attached so that the optical axis thereof has a predetermined angle with respect to the lengthwise direction of the first arm 8.

Since the inspection camera 1 is attached sideways with respect to the first arm 8, the optical axis of the camera 1 is directed toward the storage cassette when the first arm 8 assumes a sideways posture with respect to the storage cassette, i.e., when a standby posture is assumed by situating the fork 10 apart from the storage cassette. Therefore, since the thin substrates can be detected during standby time, a contribution is made to the improvement of throughput.

Although the optical axis of the inspection camera 1 is almost perpendicular to the lengthwise direction of the first arm 8, i.e., the optical axis thereof is directed at a right angle thereto, the angle of the optical axis is not limited to that of 90 degrees, and an optimum angle should be selected in accordance with, for example, the positional relationship between the thin-substrate transfer robot 5 and the storage cassette.

Since the inspection camera 1 is housed in the first arm 8, it is advantageous in the prevention of dust occurrence resulting from the inspection camera 1.

Additionally, since a signal cable (not shown) of the inspection camera 1 is drawn into the body 7 through the first arm 8, the cable is not exposed outside, which is also advantageous to measures against such dust occurrence. Additionally, since the signal cable is only slightly bent or twisted when the thin-substrate transfer robot 5 is operated, it is also advantageous to measures against the disconnection of a signal cable.

Figure 5:
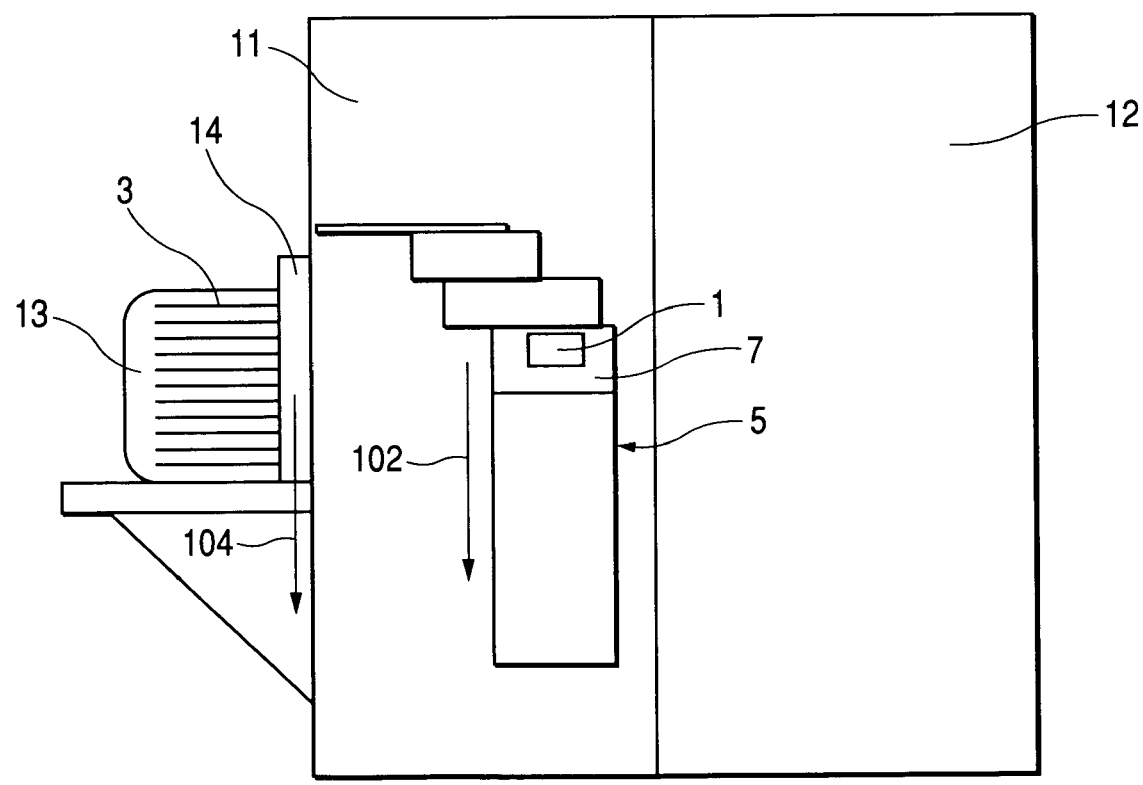
FIG. 5 is a side view showing a fifth embodiment of the present invention.
Figure 6:
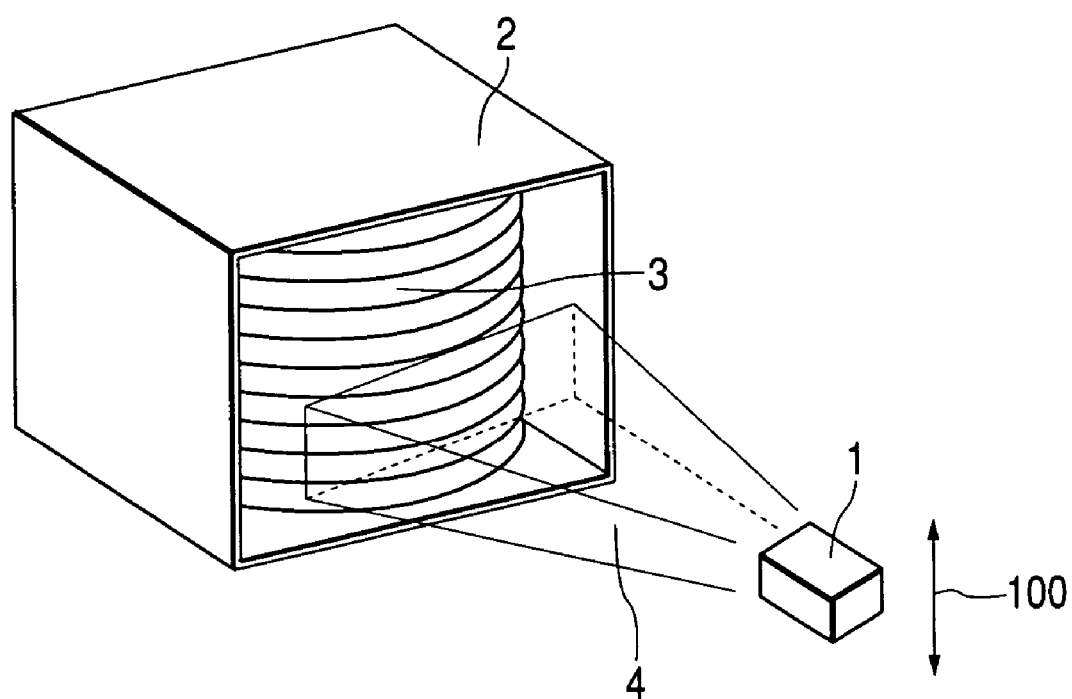
FIG. 6 is a perspective view showing the structure of a conventional thin-substrate detecting apparatus.

FIG. 5 is a side view of the thin-substrate transfer robot showing the fifth embodiment of the present invention. In the figure, 11 denotes a front end module. The front end module 11 is a kind of air lock used to carry the thin substrates stored in the storage cassette into the processing device without exposing them to outside air, in which the thin-substrate transfer robot 5 is housed. 12 denotes a processing chamber contiguous to the front end module 11, in which a processing device, not shown, is housed. 13 denotes a transfer cassette provided with a door, showing the state of being connected to the front end module 11. 14 denotes an opener, which is a device for opening the door, not shown, of the transfer cassette 13 provided with a door by displacing the door in the direction of an arrow 104 while keeping the transfer cassette 13 provided with a door connected to the front end module 11. As in the second and third embodiments, the inspection camera 1 is mounted in the body 7 of the thin-substrate transfer robot 5. Therefore, the inspection camera 1 goes up and down together with the body 7. If the body 7 is lowered in the direction of an arrow 102 synchronously with the moment when the door of the transfer cassette 13 provided with a door is opened in the direction of the arrow 104, the substrates can be detected while the door is being opened, and therefore the entire processing time can be shortened.

As described above, the present invention has the following effects.

According to the invention as set forth in Claims 1 through 3, 6, 7, and 8, since the inspection camera is mounted in the thin-substrate transfer robot and is moved using the up and down axis of the thin-substrate transfer robot, there is no need to newly provide a driving shaft for the camera, and the entire apparatus can be made compact. According to the invention as set forth in Claim 4, when the thin-substrate transfer robot assumes a posture for extracting the thin substrates, the thin substrates can be extracted without changing the position and posture at that time, and therefore the processing time can be shortened. According to the invention as set forth in Claim 5, since the direction of the camera can be changed, the camera can be adjusted most suitably for inspection.

INDUSTRIAL APPLICABILITY

The present invention is useful as a thin-substrate transfer robot that transfers thin substrates, such as liquid crystal substrates or wafers, and a wafer cassette or the like. Additionally, the present invention is useful as a method for detecting the state of thin substrates stored in a storage cassette.

What is claimed is:

1. A thin-substrate inspection method for detecting a stored state of a plurality of thin substrates stored in a storage cassette by use of a camera, wherein the camera is disposed on a thin-substrate transfer robot that transfers the thin substrates, the camera being disposed such that an optical axis of the camera is substantially horizontal, and an image of all of the thin substrates in the storage cassette is picked up by the camera by moving the thin-substrate transfer robot in a vertical direction, thereby detecting a state of the thin substrates.

2. A thin-substrate inspection method for detecting a stored state of a plurality of thin substrates stored in a storage cassette provided with a door by use of a camera, wherein the camera is disposed on a thin-substrate transfer robot that transfers the thin substrates, and an image of all of the thin substrates in the storage cassette is picked up by the camera while moving the thin-substrate transfer robot in a vertical direction synchronously with a driving device for opening the door of the storage cassette, thereby detecting a state of the thin substrates.

3. A method for detecting a stored state of a plurality of thin substrates stored in a storage cassette, comprising:
    disposing a camera on a thin-substrate transfer robot that transfers the thin substrates, the camera being disposed such that an optical axis of the camera is substantially horizontal;
    moving the thin-substrate transfer robot in a vertical direction; and
    picking an image of all of the thin substrates in the storage cassette, thereby detecting a state of the thin substrates.

4. A method for detecting a stored state of a plurality of thin substrates stored in a storage cassette provided with a door, comprising:
    disposing a camera on a thin-substrate transfer robot that transfers the thin substrates;
    moving the thin-substrate transfer robot in a vertical direction synchronously with a driving device for opening the door of the storage cassette; and
    picking an image of all of the thin substrates in the storage cassette, thereby detecting a state of the thin substrates.

* * * * *